(12) United States Patent
Qiang et al.

(10) Patent No.: US 10,465,872 B2
(45) Date of Patent: Nov. 5, 2019

(54) LIGHT SOURCE MODULE AND ILLUMINATING DEVICE

(71) Applicant: OPPLE LIGHTING CO., LTD., Shanghai (CN)

(72) Inventors: Jie Qiang, Shanghai (CN); Zhixian Zhou, Shanghai (CN)

(73) Assignee: Opple Lighting Co., Ltd., Shanghai (CN)

( * ) Notice: Subject to any disclaimer, the term of this patent is extended or adjusted under 35 U.S.C. 154(b) by 0 days.

(21) Appl. No.: 16/049,004

(22) Filed: Jul. 30, 2018

(65) Prior Publication Data

US 2018/0335189 A1    Nov. 22, 2018

Related U.S. Application Data

(63) Continuation of application No. PCT/CN2017/071553, filed on Jan. 18, 2017.

(30) Foreign Application Priority Data

Feb. 3, 2016 (CN) .......................... 2016 1 0079062
Feb. 3, 2016 (CN) ...................... 2016 2 0114061 U

(51) Int. Cl.
| F21S 10/02 | (2006.01) |
| F21V 9/38 | (2018.01) |
| F21V 9/30 | (2018.01) |
| F21V 23/00 | (2015.01) |
| F21V 23/02 | (2006.01) |

(Continued)

(52) U.S. Cl.
CPC .............. *F21S 10/023* (2013.01); *F21V 9/30* (2018.02); *F21V 23/003* (2013.01); *F21V 23/02* (2013.01); *F21Y 2115/10* (2016.08); *H01L 33/50* (2013.01)

(58) Field of Classification Search
CPC .. F21S 10/023; F21V 9/30; F21V 9/32; F21V 23/003; F21Y 2113/10
See application file for complete search history.

(56) References Cited

U.S. PATENT DOCUMENTS 5,684,359 A    11/1997  Yano
9,719,660 B1 *  8/2017  Petluri ............... C09K 11/0883
(Continued)

FOREIGN PATENT DOCUMENTS

| CN | 1121258 A | 4/1996 |
| CN | 204387966 U | 6/2015 |

(Continued)

OTHER PUBLICATIONS

Lou et al, "Illuminating device and lamp comprising illuminating device", Jun. 10, 2015, English translation of CN204387966, pp. 1-22.*

(Continued)

*Primary Examiner* — Alan B Cariaso
(74) *Attorney, Agent, or Firm* — Arch & Lake LLP

(57) ABSTRACT

The present disclosure discloses a light source module and an illuminating device. The light source module and the device include adjusting the peak wavelength, the peak intensity and the chromaticity coordinate of the blue light, the red light and the yellow-green light in the irradiation light emitted by the light source module to be within the preset ranges, respectively.

20 Claims, 6 Drawing Sheets

(51) Int. Cl.
*F21Y 115/10* (2016.01)
*H01L 33/50* (2010.01)

(56) References Cited

U.S. PATENT DOCUMENTS

| | | | | |
|---|---|---|---|---|
| 2010/0142189 A1* | 6/2010 | Hong | ............ | C09K 11/616 362/97.3 |
| 2011/0279015 A1* | 11/2011 | Negley | ............ | H05B 33/0857 313/501 |
| 2012/0262903 A1* | 10/2012 | Li | ............ | F21K 9/232 362/84 |

FOREIGN PATENT DOCUMENTS

| | | |
|---|---|---|
| CN | 105737091 A | 7/2016 |
| CN | 105823009 A | 8/2016 |
| CN | 205640713 U | 10/2016 |
| JP | 2015115507 A | 6/2015 |

OTHER PUBLICATIONS

International Search Report (ISR) and Written Opinion dated Mar. 3, 2017 for corresponding PCT/CN2017/071553, including English translation of ISR, 16 pages.

\* cited by examiner

LIGHT SOURCE MODULE AND ILLUMINATING DEVICE

CROSS-REFERENCE TO RELATED APPLICATIONS

This application is based upon and claims the priority of PCT patent application No. PCT/CN2017/071553 filed on Jan. 18, 2017 which claims the priority of Chinese Patent Application No. 201610079062.5 filed on Feb. 3, 2016, and Chinese Patent Application No. 201620114061.5 filed on Feb. 3, 2016, the entire content of all of which is hereby incorporated by reference herein for all purposes.

TECHNICAL FIELD

The present disclosure relates to the technical field of illumination, in particular to a light source module and an illuminating device.

BACKGROUND

With the rapid development of lighting technology, illuminating devices have become indispensable in people's lives. People live in a lighting environment most of the time. How to improve a person's image in the lighting environment also receives more and more attentions.

SUMMARY

The present disclose provides a light source module and an illuminating device and a method of manufacturing an illuminating device.

According to one aspect of the present disclosure, a light source module is provided. The light source module may include: a blue light generating portion configured to emit blue light; a red light generating portion configured to emit red light; and a yellow-green light generating portion configured to emit yellow-green light, where a peak wavelength of the blue light is within the range of 440 nm-460 nm; a peak wavelength of the red light is within the range of 600 nm-640 nm; a peak wavelength of the yellow-green light is within the range of 515 nm-560 nm; a peak intensity of the red light is 30% to 60% of a peak intensity of the blue light; a peak intensity of the yellow-green light is 30% to 60% of the peak intensity of the blue light; and irradiation light emitted by the light source module satisfies the following conditions in the CIE1931 chromaticity coordinate system: the horizontal coordinate X is within the range of 0.313-0.343, and the vertical coordinate Y is within the range of 0.312-0.342.

According to another aspect of the present disclosure, an illuminating device is provided. The illuminating device may include: a light source component; a power supply module connected with the light source component and configured to provide the light source component with a working power; and a controller connected with the light source component and configured to adjust irradiation light emitted by the light source component.

The light source component may include a blue light generating portion configured to emit blue light, a red light generating portion configured to emit red light, and a yellow-green light generating portion configured to emit yellow-green light, where: a peak wavelength of the blue light is within the range of 440 nm-460 nm, a peak wavelength of the red light is within the range of 600 nm-640 nm, a peak wavelength of the yellow-green light is within the range of 515 nm-560 nm, a peak intensity of the red light is 30% to 60% of a peak intensity of the blue light, a peak intensity of the yellow-green light is 30% to 60% of the peak intensity of the blue light, and irradiation light emitted by the light source component satisfies the following conditions in the CIE1931 chromaticity coordinate system: the horizontal coordinate X is within the range of 0.313-0.343, and the vertical coordinate Y is within the range of 0.312-0.342.

According to a third aspect of the present disclosure, a method of manufacturing an illuminating device is provided. The method may include: providing a light source part; and the light source part may include: a blue light generating portion configured to emit blue light, a red light generating portion configured to emit red light, and a yellow-green light generating portion configured to emit yellow-green light, wherein: a peak wavelength of the blue light is within the range of 440 nm-460 nm, a peak wavelength of the red light is within the range of 600 nm-640 nm, a peak wavelength of the yellow-green light is within the range of 515 nm-560 nm, a peak intensity of the red light is 30% to 60% of a peak intensity of the blue light, a peak intensity of the yellow-green light is 30% to 60% of the peak intensity of the blue light, and irradiation light emitted by the light source part satisfies the following conditions in the CIE1931 chromaticity coordinate system: the horizontal coordinate X is within the range of 0.313-0.343, and the vertical coordinate Y is within the range of 0.312-0.342.

It is to be understood that, both the foregoing general description and the following detailed description are exemplary and explanatory only and are not restrictive of the present disclosure.

BRIEF DESCRIPTION OF THE DRAWINGS

Various other advantages and benefits will become apparent to those skilled in the art by reading the detailed description of the following examples. The accompanying drawings are merely for the purpose of illustrating the examples and are not to be construed as any limitation to the present disclosure. Moreover, the same reference numerals in the accompanying drawings are used to indicate the same parts. In the accompanying drawings.

Figure 1:
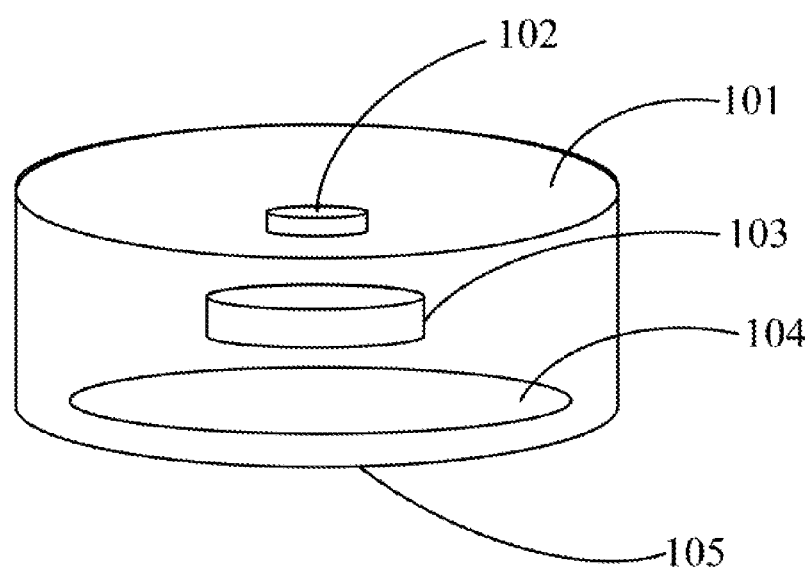
FIG. 1 is a schematic structural view of a light source module provided by an example of the present disclosure.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various examples of the present disclosure. Also, common but well-understood elements that are useful or necessary in a commercially feasible example are often not depicted in order to facilitate a less obstructed view of these various examples. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above, except where different specific meanings have otherwise been set forth herein.

DETAILED DESCRIPTION

Examples of the present disclosure provide a light source module and an illuminating device.

In order to make those skilled in the art to understand the technical solutions of the present disclosure in a better way, hereinafter the technical solutions of the examples in the present disclosure will be described in a clearly and fully understandable way in connection with the drawings related to the examples of the disclosure. Apparently, the described examples are just a part but not all of the examples of the present disclosure. Based on the described examples herein, those skilled in the art can obtain other example(s), without any inventive work, which should be within the scope of the present disclosure.

The terminology used in the present disclosure is for the purpose of describing exemplary examples only and is not intended to limit the present disclosure. As used in the present disclosure and the appended claims, the singular forms "a," "an" and "the" are intended to include the plural forms as well, unless the context clearly indicates otherwise. It shall also be understood that the terms "or" and "and/or" used herein are intended to signify and include any or all possible combinations of one or more of the associated listed items, unless the context clearly indicates otherwise.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

Impression of skin color, as an important factor in a person's appearance, reflects a person's health degree and age, and can greatly affect a person's social attraction. However, the impression of skin color is greatly affected by the lighting environment. Inappropriate lighting environment will result in worse impression of skin color and degrade the person's personal image.

Sometimes, the illuminating device may not be provided for improving an effect of skin color on the market, so the impression of a person's skin color in the lighting environment is difficult to be guaranteed.

Sometimes, it's difficult for the illuminating device to improve the impression of skin color of a person's skin. The present disclosure provides a light source module and an illuminating device which can solve the above problems. Detailed description will be given below to the foregoing light source module and illuminating device with reference to the accompanying drawings.

As illustrated in FIG. 1, an illuminating device 101 includes a controller 102, a heat radiator 103, a light source module 104 and an optical element 105. Of course, the heat radiator 103 and the optical element 105 are not necessary features of the illuminating device 101. In some lighting scenes, these two elements may be omitted. No further description will be given herein.

The illuminating device 101 may be implemented in various kinds of lighting fixtures such as ceiling lamp, decoration lamp, and even tube light and spot light, and may be applied in home environment, business environment and the like.

The controller 102 is configured to adjust a light color and a light intensity of irradiation light emitted by the light source module 104. The heat radiator 103 is configured to dissipate heat generated during the illumination of the light source module 104. The optical element 105 may be implemented in various types such as lenses and lampshades, and is configured to adjust an illumination direction and an illumination angle of the irradiation light emitted by the light source module 104.

Structures and working principles of the controller 102, the heat radiator 103 and the optical element 105 are technologies well-known to those skilled in the art. No further description will be given herein.

The light source module 104 includes a blue light generating portion, a red light generating portion and a yellow-green light generating portion, three of which are respectively configured to emit blue light, red light and yellow-green light.

The blue light generating portion may be a light-emitting unit for emitting blue light, and may also adopt a light-emitting unit for emitting light of other colors to be cooperated with a blue phosphor so as to finally emit blue light as required.

The red light generating portion may be a light-emitting unit for emitting red light, and may also adopt a light-emitting unit for emitting light of other colors to be cooperated with a red phosphor so as to finally emit red light as required.

The yellow-green light generating portion may be a light-emitting unit for emitting yellow-green light, and may also adopt a light-emitting unit for emitting light of other colors to be cooperated with a yellow-green phosphor so as to finally emit yellow-green light as required.

In the example of the present disclosure, the blue light generating portion, the red light generating portion and the yellow-green light generating portion may respectively include an independent light-emitting unit, and may also share one light-emitting unit. For instance, only the blue light generating portion includes a light-emitting unit but both of the red light generating portion and the yellow-green light generating portion may only include a phosphor, and the phosphor of the red light generating portion and the phosphor of the yellow-green light generating portion respectively adjust the blue light emitted by the blue light generating portion to be corresponding red light and yellow-green light after wavelength conversion. Of course, the case may be also that only the red light generating portion includes a light-emitting unit but both of the blue light generating portion and the yellow-green light generating portion only include a phosphor, and the phosphor of the blue light generating portion and the phosphor of the yellow-green light generating portion respectively adjust the red light emitted by the red light generating portion to be corresponding blue light and yellow-green light after wavelength conversion.

Optionally, the light-emitting unit may be a light-emitting diode (LED) element, and may also be elements of other types. No further description will be given herein.

The phosphor may adopt aluminate phosphor, silicate phosphor, nitride phosphor, sulfide phosphor or the like.

It should be noted that: the yellow-green light generating portion may include one phosphor to excite the generation of the yellow-green light; the yellow-green light generating portion may also adopt a combination of more than two phosphors, for instance, a combination of a phosphor capable of exciting yellow light and a phosphor capable of exciting green light; and the yellow-green light generating portion even may be formed by a combination of phosphors with multiple peak wavelengths. When the yellow-green light generating portion is formed by a combination of a plurality of types of phosphors, these phosphors are not limited to be contained in only one component or element. For instance, different yellow-green light phosphors contained in two white-light LED elements may be adopted, and a spectral intensity within the range of 515 nm-560 nm as required is obtained by superimposing spectrums generated by these phosphors. Such combination of phosphors is not limited to the yellow-green light generating portion. When the blue light generating portion and the red light generating portion each include a phosphor, these phosphors may be of multiple ingredients, and may be distributed in different components or elements. In addition, the yellow-green light phosphor herein preferably adopts a broad-band phosphor. Broad-band phosphor is a common concept in the industry, and refers to phosphor powder for exciting light with a relatively wider, full-width half-peak (FWHM). "Relatively wider" herein is used relative to narrow-band fluorescent materials such as yttrium-europium oxide (red powder) and quantum dot phosphor. The FWHM of the broad-band phosphor in the present disclosure is preferably greater than 30 nm, more preferably, greater than 40 nm, particularly preferably, greater than 50 nm, and extraordinarily preferably, greater than 80 nm. In addition, the red light phosphor may also adopt a broad-band phosphor, and the red light wave band may be adjacent to the green light wave band. When the red light generating portion also adopts the broad-band phosphor, there will be certain energy in the green light wave band. In this way, the light intensity of this wave band may also be increased to a certain degree after being superimposed with the light emitted by the yellow-green light generating portion, so as to be in accordance with the spectrum required by the present disclosure. It should be noted that the "red light generating portion" and the "yellow-green light generating portion" herein are just an expression for illustration of the present disclosure. For example, when the red light phosphor has a relatively wider, emission bandwidth, there must be some energy in a yellow-green region. In this case, it may be appreciated that the red light phosphor partially realizes the function of the red light generating portion and partially contributes to the emission of the yellow-green light; that is to say, the yellow-green light generating portion includes both of a yellow-green light phosphor and a red light phosphor.

Detailed description will be given below to the composition of the irradiation light emitted by the illuminating device 101, in combination with the structure of the illuminating device 101.

Figure 2:
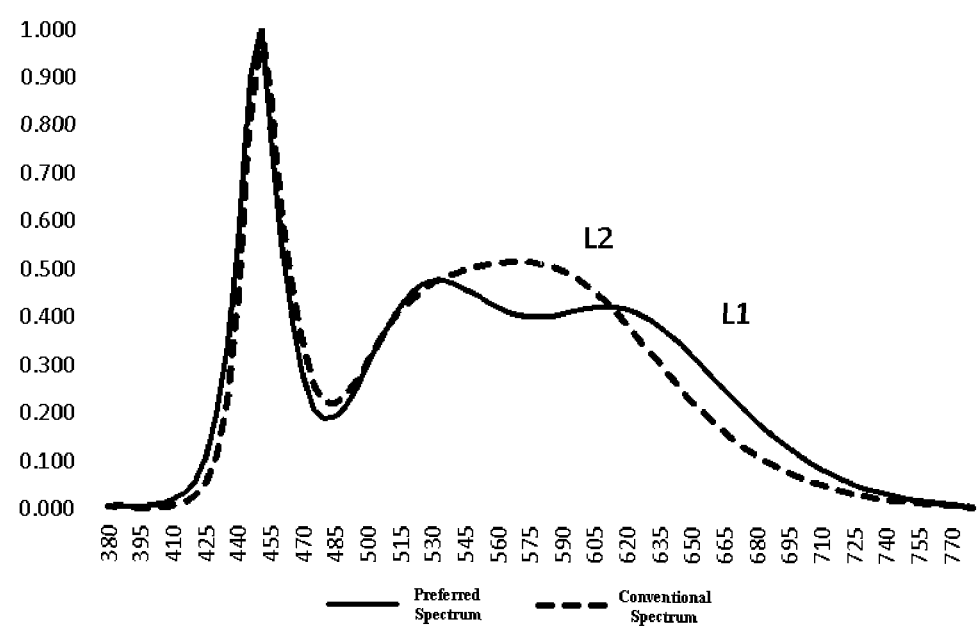
FIG. 2 is a comparative spectrum diagram of irradiation light emitted by an illuminating device according to an example of the present disclosure with respect to irradiation light according to the prior art, both under a color temperature of 5700K.

FIG. 2 is a comparative spectrum diagram of irradiation light emitted by the illuminating device 102 with respect to irradiation light in the prior art. L1 is a spectral distribution curve of the illuminating device 101 provided by the present disclosure under a color temperature of 5700K. The dotted line L2 is a spectral distribution curve of an existing illuminating device under a color temperature of 5700K, and a main peak of the curve represents blue light with a wavelength of 450 nm. Herein, energy of the main peak is set as 1, and energy of other points in the curve is denoted by a ratio with relative to the energy of the main peak; then the peak of the red light in L1 is closer to long wave, and the peak intensity is also higher, as compared with that in L2; also, the spectral intensity at 560 nm-590 nm in L1 is lower than that in the spectrum of L2. It has been proved through a large number of tests that: the whiteness degree, the ruddiness degree and the health degree of the skin under the lighting environment of L1 are significantly superior over those under the lighting environment of L2.

The color temperature of 5700K is substantially close to a range of color temperature of a current commercial place. The irradiation light emitted by the illuminating device 101 provided by the present disclosure greatly improves the impression of a person's skin at commercial places.

In the example of the present disclosure, the peak wavelength of the blue light is within the range of 440 nm-460 nm.

The peak wavelength of the red light is within the range of 600 nm-640 nm, and the peak intensity of the red light is 30% to 60% of the peak intensity of the blue light. By adopting the red light on the basis of the blue light, the impression of skin may be ruddier, which is in line with the aesthetic need of Chinese people; and the health degree of skin is also greatly improved. Moreover, by setting the peak wavelength and the peak intensity of the red light, the red light will not cover the blue light and will not make the skin to appear too red to result in an abnormal impression.

In the example of the present disclosure, the peak intensity of the red light is the lower limit value of the range of the peak intensity of the blue light, and may also be 35%, or moreover, 40% of the peak intensity of the blue light; the peak intensity of the red light is the upper limit value of the range of the peak intensity of the blue light, and may also be 55%, or moreover, 50% of the peak intensity of the blue light. By combining the upper limit value with the lower limit value of this range, a range such as 35%-55%, 40%-55% or 40%-50% is obtained. The red light within these ranges can achieve the objective of the present disclosure.

The peak wavelength of the yellow-green light is within the range of 515 nm-560 nm, and the peak intensity of the yellow-green light is 30% to 60% of the peak intensity of the blue light. By adopting the yellow-green light on the basis of the blue light and the red light, the ability of the yellow-green light in harmonizing light color is utilized to obtain more realistic impression of skin and to ensure the trueness of the impression of skin.

In the example of the present disclosure, the peak intensity of the yellow-green light is the lower limit value of the range of the peak intensity of the blue light, and may also be 35%, or moreover, 40% of the peak intensity of the blue light; the peak intensity of the red light is the upper limit value of the range of the peak intensity of the blue light, and may also be 55%, or moreover, 50%, or even furthermore, 47% of the peak intensity of the blue light. By combining the upper limit value with the lower limit value of these ranges, a range such as 35%-55%, 40%-55%, 40%-50% and 40%-47% can be obtained. The yellow-green light with these ranges can achieve the objective of the present disclosure.

The irradiation light emitted by the light source module meets the following conditions in the CIE1931 chromaticity coordinate system: the horizontal coordinate X is within the range of 0.313-0.343, and the vertical coordinate Y is within the range of 0.312-0.342. The chromaticity coordinate reflects a position of a measured object in a chromaticity diagram, and uses mathematical method to represent basic parameters of color. The horizontal coordinate X and the vertical coordinate Y may be obtained by the following ways: after obtaining the spectrum $P(\lambda)$, tristimulus functions $x(\lambda)$, $y(\lambda)$ and $z(\lambda)$ may be respectively multiplied by corresponding wavelengths in the spectrum P(λ), and then may be accumulated to obtain tristimulus values x, y, z. Subsequently, performing a conversion of the tristimulus values x, y, z so as to obtain the horizontal coordinate X=X/(x+y+z) and the vertical coordinate Y=Y/(x+y+z) of the chromaticity coordinate. The chromaticity coordinate system is a technology well-known to those skilled in the art. No further description will be given herein.

The CIE 1931 color spaces are defined quantitative links between distributions of wavelengths in the electromagnetic visible spectrum, and physiologically perceived colors in human color vision. The mathematical relationships that define these color spaces are tools for color management, and are important when dealing with color inks, illuminated displays, and recording devices such as digital cameras.

It should be noted that: when the irradiation light of the light source module is determined to meet the above conditions in the CIE1931 chromaticity coordinate system, there is no light in the environment provided with the light source module, so as to prevent the irradiation light emitted by the light source module from being polluted due to other light doped into the irradiation light emitted by the light source module, and hence to avoid the problem that it's unable to accurately determine the position of the irradiation light emitted by the light source module in the chromaticity diagram.

In the example of the present disclosure, the light source module may be placed in a darkroom or a black box isolated from external light, so there is no light in the environment provided with the light source module, and hence the irradiation light emitted by the light source module is deemed as meeting the above conditions in the CIE1931 chromaticity coordinate system.

In the example of the present disclosure, the conditions in the chromaticity coordinate system may be adjusted in such a manner that: the horizontal coordinate X is within the range of 0.318-0.338, and the vertical coordinate Y is within the range of 0.317-0.337.

In the example of the present disclosure, the conditions in the chromaticity coordinate system may also be adjusted in such a manner that: the horizontal coordinate X is within the range of 0.323-0.333, and the vertical coordinate Y is within the range of 0.322-0.332.

The illuminating device provided by the present disclosure is mainly applied to illumination, and can improve the impression of skin in the lighting environment. The irradiation light requires a light color close to white, and only the light color falling within the range of CIE1931 chromaticity coordinate as defined above can realize the conventional lighting ability and meanwhile improving the whiteness degree, the ruddiness degree, the health degree, the naturalness and the vividness of skin.

Description will be given below to several examples of the illuminating device 101 in respect to various combinations above.

Figure 3:
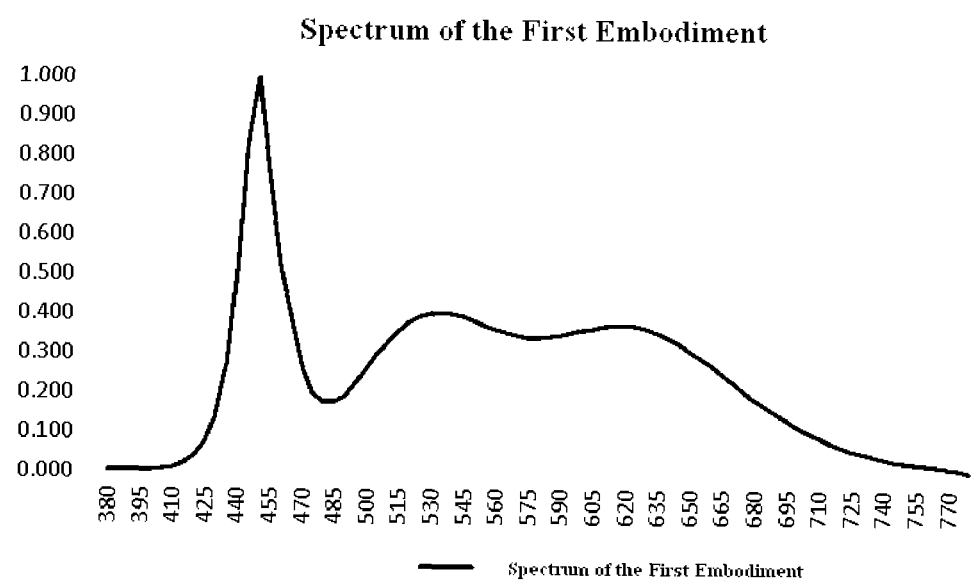
FIGS. 3 to 6 are spectrum diagrams of the irradiation light emitted by the illuminating device according to a first example to a fourth example of the present disclosure.

In a first example, a blue light LED chip with a peak wavelength of 450±5 nm is arranged on the illuminating device 101 and used as the blue light generating portion; a red light phosphor capable of converting part of the blue light emitted by the blue light generating portion into red light is used as the red light generating portion; and a yellow-green light phosphor capable of converting part of the blue light emitted by the blue light generating portion into yellow-green light is used as the yellow-green light generating portion. In the present example, the blue light LED chip not only is used as the blue light generating portion but also is an excitation light source of both of the red light generating portion and the yellow-green light generating portion. FIG. 3 is a relative spectral energy distribution diagram of the first example. The blue light emitted by the blue light LED chip forms a first peak. A peak emission wavelength of the first peak is at 450 nm, with a FWHM of about 20 nm. A red light phosphor converts part of the blue light emitted by the blue light LED chip into red light of 600 nm-640 nm, which forms a second peak. A peak emission wavelength of the second peak is at 625 nm, with a peak intensity of about 38% of the first peak intensity. A yellow-green light phosphor converts part of the blue light emitted by the blue light LED chip into yellow-green light of 515 nm-560 nm, which forms a third peak. A peak emission wavelength of the third peak is at 535 nm, with a peak intensity of about 41% of the first peak intensity. A spectral intensity at 580 nm is 34% of that of the first peak. The chromaticity coordinate in the first example is that x=0.3219 and y=0.3189, which complies with a preferred spectral value obtained from the tests.

Figure 4:
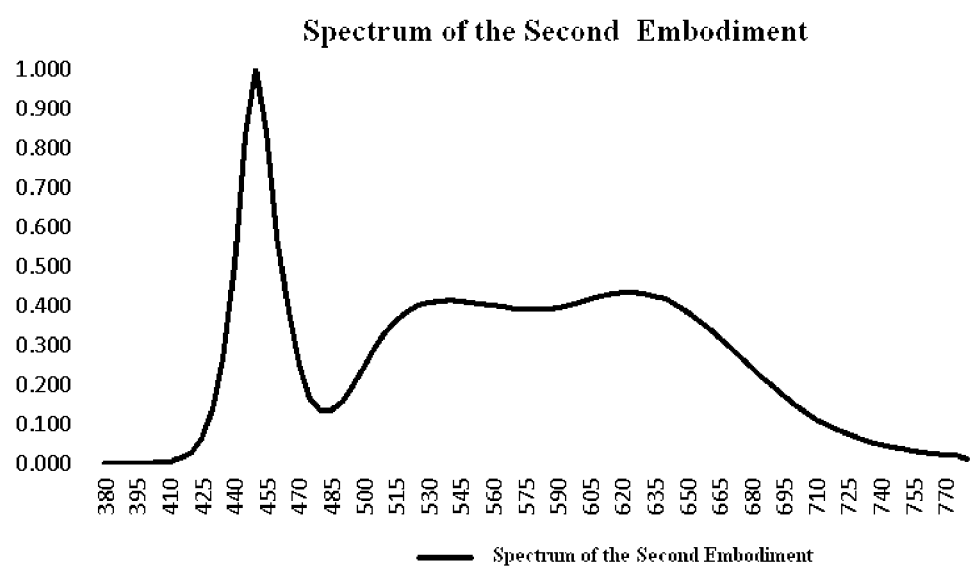

In a second example, a blue light LED chip with a peak wavelength of 450±5 nm is arranged on the illuminating device 101 and used as the blue light generating portion; a red light phosphor capable of converting part of the blue light emitted by the blue light generating portion into red light is used as the red light generating portion; and a yellow-green light phosphor capable of converting part of the blue light emitted by the blue light generating portion into yellow-green light is used as the yellow-green light generating portion. In the present example, the blue light LED chip not only is used as the blue light generating portion but also is an excitation light source of both of the red light generating portion and the yellow-green light generating portion. FIG. 4 is a relative spectral energy distribution diagram of the second example. The blue light emitted by the blue light LED chip forms a first peak. A peak emission wavelength of the first peak is at 450 nm, with a FWHM of about 20 nm. A red light phosphor converts part of the blue light emitted by the blue light LED chip into red light of 610 nm-650 nm, which forms a second peak. A peak emission wavelength of the second peak is at 630 nm, with a peak intensity of about 43% of the first peak intensity. A yellow-green light phosphor converts part of the blue light emitted by the blue light LED chip into yellow-green light of 515 nm-560 nm, which forms a third peak. A peak emission wavelength of the third peak is at 535 nm, with a peak intensity of about 41% of the first peak intensity. A spectral intensity at 580 nm is 40% of that of the first peak. The chromaticity coordinate of the second example is that x=0.3363 and y=0.3176, which complies with a preferred spectral value obtained from the tests.

Figure 5:
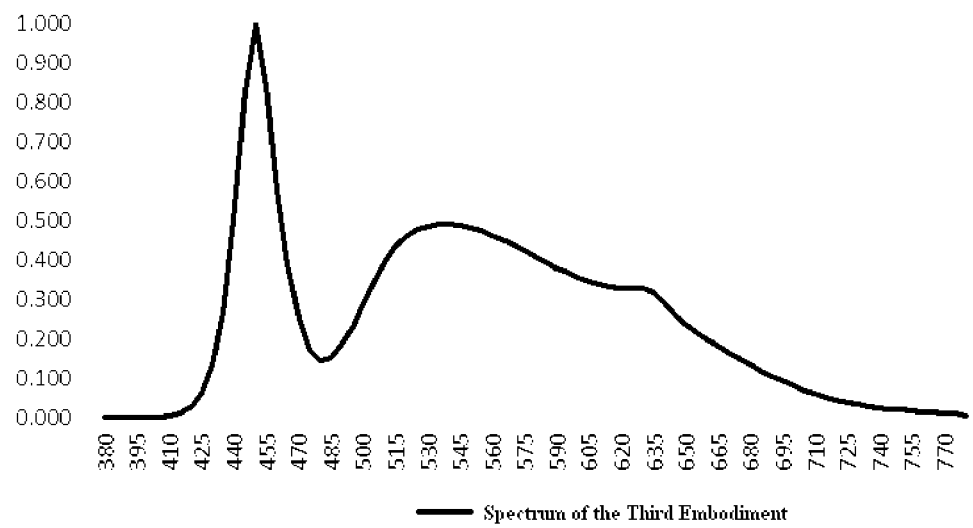

In a third example, a blue light LED chip with a peak wavelength of 460±5 nm is arranged on the illuminating device 101 and used as the blue light generating portion; a red light phosphor capable of converting part of the blue light emitted by the blue light generating portion into red light is used as the red light generating portion; and a yellow-green light phosphor capable of converting part of the blue light emitted by the blue light generating portion into yellow-green light is used as the yellow-green light generating portion. In the present example, the blue light LED chip not only is used as the blue light generating portion but also is an excitation light source of both of the red light generating portion and the yellow-green light generating portion. FIG. 5 is a relative spectral energy distribution diagram of the third example. The blue light emitted by the blue light LED chip forms a first peak. A peak emission wavelength of the first peak is at 460 nm, with a FWHM of about 20 nm. A red light phosphor converts part of the blue light emitted by the blue light LED chip into red light of 610 nm-650 nm, which forms a second peak. A peak emission wavelength of the second peak is at 630 nm, with a peak intensity of about 33% of the first peak intensity. A yellow-green light phosphor converts part of the blue light emitted by the blue light LED chip into yellow-green light of 515 nm-560 nm, which forms a third peak. A peak emission wavelength of the third peak is at 535 nm, with a peak intensity of about 49% of the first peak intensity. A spectral intensity at 580 nm is 33% of that of the first peak. The chromaticity coordinate of the third example is that x=0.3139 and y=0.3357, which complies with a preferred spectral value obtained from tests.

Figure 6:
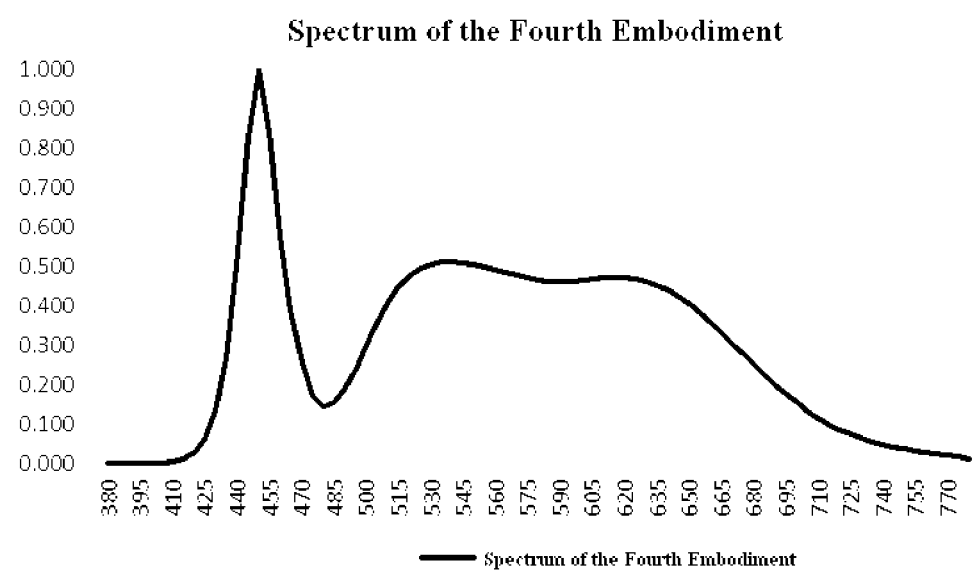

In a fourth example, a blue light LED chip with a peak wavelength of 450±5 nm is arranged on the illuminating device 101 and used as the blue light generating portion; a red light phosphor capable of converting part of the blue light emitted by the blue light generating portion into red light is used as the red light generating portion; and a yellow-green light phosphor capable of converting part of the blue light emitted by the blue light generating portion into yellow-green light is used as the yellow-green light generating portion. In the present example, the blue light LED chip not only is used as the blue light generating portion but also is an excitation light source of both of the red light generating portion and the yellow-green light generating portion. FIG. 6 is a relative spectral energy distribution diagram of the fourth example. The blue light emitted by the blue light LED chip forms a first peak. A peak emission wavelength of the first peak is at 450 nm, with a FWHM of about 20 nm. A red light phosphor converts part of the blue light emitted by the blue light LED chip into red light of 610 nm-650 nm, which forms a second peak. A peak emission wavelength of the second peak is at 625 nm, with a peak intensity of about 46.8% of the first peak intensity. A yellow-green light phosphor converts part of the blue light emitted by the blue light LED chip into yellow-green light of 515 nm-560 nm, which forms a third peak. A peak emission wavelength of the third peak is at 540 nm, with a peak intensity of about 51% of the first peak intensity. A spectral intensity at 580 nm is 46.1% of that of the first peak. The chromaticity coordinate of the fourth example is that x=0.3409 and y=0.3413, which complies with a preferred spectral value obtained from tests.

the present disclosure is proposed to provide a light source module and an illuminating device which can solve the above-mentioned problems, or at least partly solve or mitigate the above-mentioned problems.

The objective of the examples of the present disclosure is to provide a light source module and an illuminating device which can improve the impression of skin color.

According to one aspect of the present disclosure, it provides a light source module, including: a blue light generating portion configured to emit blue light; a red light generating portion configured to emit red light; and a yellow-green light generating portion configured to emit yellow-green light, wherein a peak wavelength of the blue light is within the range of 440 nm-460 nm; a peak wavelength of the red light is within the range of 600 nm-640 nm; a peak wavelength of the yellow-green light is within the range of 515 nm-560 nm; a peak intensity of the red light is 30% to 60% of a peak intensity of the blue light; a peak intensity of the yellow-green light is 30% to 60% of the peak intensity of the blue light; and irradiation light emitted by the light source module satisfies the following conditions in the CIE1931 chromaticity coordinate system: the horizontal coordinate X is within the range of 0.313-0.343, and the vertical coordinate Y is within the range of 0.312-0.342.

Preferably, the peak intensity of the red light is 35% to 55% of the peak intensity of the blue light.

Preferably, the peak intensity of the red light is 40% to 55% of the peak intensity of the blue light.

Preferably, the peak intensity of the red light is 40% to 50% of the peak intensity of the blue light.

Preferably, the peak intensity of the yellow-green light is 35% to 55% of the peak intensity of the blue light.

Preferably, the peak intensity of the yellow-green light is 40% to 50% of the peak intensity of the blue light.

Preferably, the peak intensity of the yellow-green light is 40% to 47% of the peak intensity of the blue light.

Preferably, the horizontal coordinate X is within the range of 0.318-0.338, and the vertical coordinate Y is within the range of 0.317-0.337.

Preferably, the horizontal coordinate X is within the range of 0.323-0.333, and the vertical coordinate Y is within the range of 0.322-0.332.

According to another aspect of the present disclosure, it provides an illuminating device, including: the light source module according to preceding contents of the present disclosure; a power supply module connected with the light source module and configured to provide the light source module with a working power; and a controller connected with the light source module and configured to adjust irradiation light emitted by the light source module.

As can be seen from the above technical solutions provided by the examples of the present disclosure, in the light source module and the illuminating device using the same as provided by the examples of the present disclosure, the irradiation light emitted by the light source module can well improve the impression of skin color of a person's skin by adjusting the peak wavelength, the peak intensity and the chromaticity coordinate of the blue light, the red light and the yellow-green light in the irradiation light emitted by the light source module to be within the preset ranges, respectively.

The device disclosed herein may achieve improving the impression of skin color of a person's skin by the irradiation light emitted by the light source module. The examples in the description are described in a progressive manner. Same or similar parts among the examples may refer to each other. Each example focuses on the difference(s) from other example(s). In particular, the system example is basically similar to the method example, and hence the description thereof is relatively simple, with relevant parts referring to corresponding description of the method example.

The present disclosure may include dedicated hardware implementations such as application specific integrated circuits, programmable logic arrays and other hardware devices. The hardware implementations can be constructed to implement one or more of the methods described herein. Applications that may include the apparatus and systems of various examples can broadly include a variety of electronic and computing systems. One or more examples described herein may implement functions using two or more specific interconnected hardware modules or devices with related control and data signals that can be communicated between and through the modules, or as portions of an application-specific integrated circuit. Accordingly, the computing system disclosed may encompass software, firmware, and hardware implementations. The terms "module," "sub-module," "circuit," "sub-circuit," "circuitry," "sub-circuitry," "unit," or "sub-unit" may include memory (shared, dedicated, or group) that stores code or instructions that can be executed by one or more processors. The module may be a hardware component or an element with or without an electronic circuit.

The foregoing merely are examples of the present disclosure, but not limitative to the present disclosure. For those skilled in the art, various modifications and changes may be made to the present disclosure. Any modification, equivalent, improvement and the like that is made within the spirit and principle of the present disclosure are within the protection scope of the appended claims of the present disclosure. The description provided herein contains plenty of specific details. However, it should be appreciated that, the examples of the present disclosure may be implemented without these specific details. In some examples, well-known methods, structures and technologies are not specifically illustrated so as not to obscure the understanding of the present description.

What is claimed is:

1. A light source module, comprising:
   a blue light generating portion configured to emit blue light;
   a red light generating portion configured to emit red light; and
   a yellow-green light generating portion configured to emit yellow-green light, wherein
   a peak wavelength of the blue light is within the range of 440 nm-460 nm;
   a peak wavelength of the red light is within the range of 600 nm-640 nm;
   a peak wavelength of the yellow-green light is within the range of 515 nm-560 nm;
   a peak intensity of the red light is 30% to 60% of a peak intensity of the blue light;
   a peak intensity of the yellow-green light is 30% to 60% of the peak intensity of the blue light; and
   irradiation light emitted by the light source module satisfies the following conditions in the CIE1931 chromaticity coordinate system:
   the horizontal coordinate X is within the range of 0.313-0.343, and the vertical coordinate Y is within the range of 0.312-0.342.

2. The light source module according to claim 1, wherein the peak intensity of the red light is 35% to 55% of the peak intensity of the blue light.

3. The light source module according to claim 2, wherein the peak intensity of the red light is 40% to 55% of the peak intensity of the blue light.

4. The light source module according to claim 3, wherein the peak intensity of the red light is 40% to 50% of the peak intensity of the blue light.

5. The light source module according to claim 1, wherein the peak intensity of the yellow-green light is 35% to 55% of the peak intensity of the blue light.

6. The light source module according to claim 5, wherein the peak intensity of the yellow-green light is 40% to 50% of the peak intensity of the blue light.

7. The light source module according to claim 6, wherein the peak intensity of the yellow-green light is 40% to 47% of the peak intensity of the blue light.

8. The light source module according to claim 1, wherein the horizontal coordinate X is within the range of 0.318-0.338, and the vertical coordinate Y is within the range of 0.317-0.337.

9. The light source module according to claim 8, wherein the horizontal coordinate X is within the range of 0.323-0.333, and the vertical coordinate Y is within the range of 0.322-0.332.

10. An illuminating device, comprising:
    a light source component;
    a power supply module connected with the light source component and configured to provide the light source component with a working power; and
    a controller connected with the light source component and configured to adjust irradiation light emitted by the light source component; and
    wherein the light source component comprises:
    a blue light generating portion configured to emit blue light,
    a red light generating portion configured to emit red light, and
    a yellow-green light generating portion configured to emit yellow-green light, wherein:
    a peak wavelength of the blue light is within the range of 440 nm-460 nm,
    a peak wavelength of the red light is within the range of 600 nm-640 nm,
    a peak wavelength of the yellow-green light is within the range of 515 nm-560 nm,
    a peak intensity of the red light is 30% to 60% of a peak intensity of the blue light,
    a peak intensity of the yellow-green light is 30% to 60% of the peak intensity of the blue light, and
    irradiation light emitted by the light source component satisfies the following conditions in the CIE1931 chromaticity coordinate system:
    the horizontal coordinate X is within the range of 0.313-0.343, and the vertical coordinate Y is within the range of 0.312-0.342.

11. The illuminating device according to claim 10, wherein the peak intensity of the red light is 35% to 55% of the peak intensity of the blue light.

12. The illuminating device according to claim 11, wherein the peak intensity of the red light is 40% to 55% of the peak intensity of the blue light.

13. The illuminating device according to claim 12, wherein the peak intensity of the red light is 40% to 50% of the peak intensity of the blue light.

14. The illuminating device according to claim 10, wherein the peak intensity of the yellow-green light is 35% to 55% of the peak intensity of the blue light.

15. The illuminating device according to claim 14, wherein the peak intensity of the yellow-green light is 40% to 50% of the peak intensity of the blue light.

16. The illuminating device according to claim 15, wherein the peak intensity of the yellow-green light is 40% to 47% of the peak intensity of the blue light.

17. The illuminating device according to claim 10, wherein the horizontal coordinate X is within the range of 0.318-0.338, and the vertical coordinate Y is within the range of 0.317-0.337.

18. The illuminating device according to claim 17, wherein the horizontal coordinate X is within the range of 0.323-0.333, and the vertical coordinate Y is within the range of 0.322-0.332.

19. A method of manufacturing an illuminating device, comprising:
    providing a light source part; wherein the light source part comprises:
    a blue light generating portion configured to emit blue light,
    a red light generating portion configured to emit red light, and
    a yellow-green light generating portion configured to emit yellow-green light, wherein:

a peak wavelength of the blue light is within the range of 440 nm-460 nm, a peak wavelength of the red light is within the range of 600 nm-640 nm, a peak wavelength of the yellow-green light is within the range of 515 nm-560 nm, a peak intensity of the red light is 30% to 60% of a peak intensity of the blue light, a peak intensity of the yellow-green light is 30% to 60% of the peak intensity of the blue light, and irradiation light emitted by the light source part satisfies the following conditions in the CIE1931 chromaticity coordinate system:

the horizontal coordinate X is within the range of 0.313-0.343, and the vertical coordinate Y is within the range of 0.312-0.342.

20. The method according to claim 19, further comprising:

providing a power supply connected with the light source part and configured to provide the light source part with a working power; and providing a controller connected with the light source part and configured to adjust irradiation light emitted by the light source part.

* * * * *